United States Patent
Ducros et al.

(10) Patent No.: US 10,724,345 B2
(45) Date of Patent: Jul. 28, 2020

(54) METHOD FOR EXPLOITATION OF A SEDIMENTARY BASIN BY MEANS OF MAPS OF TOTAL ORGANIC CARBON AND HYDROGEN INDEX

(71) Applicant: IFP Energies nouvelles, Rueil-Malmaison (FR)

(72) Inventors: Mathieu Ducros, Rueil-Malmaison (FR); Benoit Chauveau, Paris (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 295 days.

(21) Appl. No.: 15/374,646

(22) Filed: Dec. 9, 2016

(65) Prior Publication Data
US 2017/0167230 A1 Jun. 15, 2017

(30) Foreign Application Priority Data

Dec. 10, 2015 (FR) .................... 15 62115

(51) Int. Cl.
| | |
|---|---|
| *E21B 41/00* | (2006.01) |
| *G01V 99/00* | (2009.01) |
| *G06F 30/20* | (2020.01) |
| *E21B 49/00* | (2006.01) |
| *E21B 43/00* | (2006.01) |

(52) U.S. Cl.
CPC .......... *E21B 41/0092* (2013.01); *E21B 49/00* (2013.01); *G01V 99/00* (2013.01); *G06F 30/20* (2020.01); *E21B 43/00* (2013.01)

(58) Field of Classification Search
None
See application file for complete search history.

(56) References Cited

U.S. PATENT DOCUMENTS

| | | |
|---|---|---|
| 8,150,669 B2 | 4/2012 | Cacas et al. |
| 8,753,867 B2 | 6/2014 | Carpentier |
| (Continued) | | |

FOREIGN PATENT DOCUMENTS

| | | | |
|---|---|---|---|
| EP | 2 743 738 A1 | 6/2014 | |
| EP | 2743738 A1 * | 6/2014 | ........... G01V 99/005 |
| (Continued) | | | |

OTHER PUBLICATIONS

Martinez, Eduardo. "Shale Gas Evaluation—Exploration" Nov. 27, 2012. 29 pages. (Year: 2012).*

(Continued)

*Primary Examiner* — Suzanne Lo
(74) *Attorney, Agent, or Firm* — Fitch, Even, Tabin & Flannery LLP (57) ABSTRACT

The present invention relates to a method for exploitation of a sedimentary basin. Exploitation of the sedimentary basin is permitted by the choice of zones of interest within the basin, the zones being determined by use of maps of total organic carbon TOC and of hydrogen index HI of at least one sedimentary layer. According to the invention, the maps of total organic carbon TOC and of hydrogen index HI are obtained taking into account the current values of $TOC_A(W)$ and $HI_A(W)$ at the level of the well and taking into account the maps of bathymetry BM and of sedimentation rate SM.

21 Claims, 3 Drawing Sheets

(56) References Cited

U.S. PATENT DOCUMENTS

| | | | |
|---|---|---|---|
| 2010/0175886 A1* | 7/2010 | Bohacs | G01V 99/00 166/369 |
| 2014/0163883 A1 | 6/2014 | Granjeon et al. | |
| 2015/0081265 A1* | 3/2015 | Kauerauf | G06F 17/5009 703/10 |

FOREIGN PATENT DOCUMENTS

| | | |
|---|---|---|
| FR | 2888251 A1 | 1/2007 |
| FR | 2930350 A1 | 10/2009 |
| WO | 2014/040622 A1 | 3/2014 |

OTHER PUBLICATIONS

Khooshnoodkia et al. "TOC determination of Gadvan Formation in South Pars Gas field, using artificial intelligent systems and geochemical data" Journal of Petroleum Science and Engineering 78, pp. 119-130. (Year: 2011).*

Pathirana et al. "Towards an improved organic carbon budget for the western Barents Sea Shelf", Clim. Past, 10, pp. 569-587. (Year: 2014).*

Search Report issued in corresponding French Application No. 15/62.115 dated Aug. 16, 2016 (9 Pages).

Celestine Eze: "Modelling organic carbon 1-5,7, distribution influenced by the presence of 10,11 an oxygen minimum zone," Jun. 1, 2014, XP055295725 (100 pages).

Ane Lothe, "Exploration Technologies at SINTEF Petroleum Research," Joining Forces Seminar, May 22, 2013, XP055295635, p. 6-p. 18 (20 pages).

Eduardo Martinez: 11 Shale Gas Evaluation 6-Exploration 11, Nov. 27, 2012, XP055249896 (29 pages).

Mehdi Khoshnoodkia et al "TOC determination of Gadvan Formation in South Pars Gas field, using artificial Intelligent systems and geochemical data," Journal of Petroleum Science and Engineering, Elsevier, Amsterdam, NL, vol. 78, No. 1, May 1, 2011, pp. 119-130 (12 Pages).

Sylta, Modeling techniques for hydrocarbon migration, in EAGE 64th Conference and Exhibition, Florence, 2002 (12 Pages).

Carruthers, Transport modeling of secondary oil migration using gradient-driven invasion percolation techniques. PhD thesis, Heriot-Watt University, Edinburgh, Scotland, UK, 1998 (333 pages).

Schneider, Modeling multi-phase flow of petroleum at the sedimentary basin scale. Journal of Geochemical Exploration 78-79 (2003) 693-696 (4 Pages).

Steckler M.S., and A.B. Watts, Subsidence of the Atlantic-type continental margin off New York, Earth Planet. Sci. Lett., 41, 1-13, 1978 (13 Pages).

* cited by examiner

METHOD FOR EXPLOITATION OF A SEDIMENTARY BASIN BY MEANS OF MAPS OF TOTAL ORGANIC CARBON AND HYDROGEN INDEX

CROSS-REFERENCE TO RELATED APPLICATION

Reference is made to French Patent Application No. 15/62.115 filed Dec. 10, 2015, which is incorporated herein by reference in its entirety.

BACKGROUND OF THE INVENTION

Field of the Invention

The present invention relates to the field of oil exploration for finding deposits of hydrocarbons in a sedimentary basin.

Description of the Prior Art

The general approach comprises going back and forth between:
  expert assessments and geological studies for assessing the oil and gas potential of the sedimentary basin, carried out on the basis of the available data (outcrops, seismic surveys, drilling). This experimental assessment attempts:
    Better understanding of the architecture and the geological history of the subsoil, notably to study whether processes of maturation and migration of hydrocarbons h have taken place;
    Identifying the zones of the subsoil in which these hydrocarbons have accumulated;
    Establishing which zones offer the best economic potential, evaluated on a basis of volume and nature of the hydrocarbons probably trapped (viscosity, degree of mixing with water, chemical composition etc.), as well as their cost of exploitation (controlled for example by the depth and fluid pressure).
  Exploratory drilling in the various zones which offer the best potential, to confirm or contradict the potential previous estimates and to acquire new data for new, more accurate studies.
  In some sedimentary basins that have gone through a complicated geological history with interaction of numerous physical processes, or when the volume of data is very large, a simple human intervention of expert assessment is not sufficient for predicting the location and the economic importance of deposits. An approach is then adopted that uses information technology tools for summarizing the available data and simulating the geological history and the multiple physical processes controlling it. This approach is called "basin modeling". It supplies a predictive mapping of the subsoil indicating the probable location of the deposits, as well as the content, nature and pressure of the hydrocarbons that are trapped there.
  Understanding of the principles of the origin of the hydrocarbons and of their connections with the geological history of the subsoil has made it possible to develop methods for predicting the oil and gas potential and the location of the deposits in sedimentary basins. These methods are based on geological observations of the terrain and expert geologists integrating knowledge and reasoning for supplying hypotheses to scenarios of formation, migration and trapping of the hydrocarbons for each basin being studied. Exploratory drilling is then carried out following these recommendations, with a success rate of the order of one discovery of a deposit for 10 wells drilled. The information supplied by this phase of expert assessment was essentially qualitative.
  In the 1980s, the development of information technology supplied new tools for assisting geologists in this approach, which helped them supply information that is quantitative and more reliable, and thus increased success rate. Numerous computer programs were developed to better understand and quantify each of the geological phenomena controlling the formation, migration and trapping of hydrocarbons. Among these tools, is the so-called "basin modeling (or simulation)" software.

Basin Modeling

Basin modeling software makes possible stimulation, in one, two or three dimensions, sedimentary, tectonic, thermal, and hydrodynamic processes and processes of organic and inorganic chemistry that are involved during formation of a petroleum basin. This software constitutes a basic tool for oil exploration, which provides all of the output data required for predicting the location of the deposits and their economic importance.

The approach followed by most of the basin models comprises three steps:
1. a step of constructing a grid of the subsoil based on a hypothesis about its internal architecture and the properties that characterize each grid cell as for example their porosity, their sedimentary nature (clay, sand etc.) or their content of organic matter at the time of sedimentation. Construction of this model is based on data acquired by seismic surveys or measurements during drilling. This grid is structured in layers with one group of grid cells being assigned to each geological stratum of the modeled basin.
2. a step of reconstruction of the grid representing previous states of the architecture of the basin. This step is carried out using, for example, a "backstripping" method (Steckler, M. S., and A. B. Watts, Subsidence of the Atlantic-type continental margin off New York, Earth Planet. Sci. Lett., 41, 1-13, 1978.) or a structural restoration method described for example in French Patent Application 2930350 corresponding to U.S. Pat. No. 8,150,669.
3. a step of numerical simulation of a selection of physical phenomena occurring during the evolution of the basin and contributing to formation of the oil traps. This step is based on a discretized representation of time in "events". Each event is simulated by a succession of time steps. The start and the end of an event corresponds to two successive states in the evolution of the architecture of the basin supplied in the preceding step 2.

Origin of the Hydrocarbons

Among the physical phenomena taken into account in step 3 above, notably the transformation of the organic matter initially buried with the sediments into hydrocarbons, and the movement of these hydrocarbons from the rocks in which they were formed to those where they are trapped, are simulated.

The methods of basin modeling currently proposed make possible simulations of three possible processes for formation of hydrocarbons:
  By direct action of certain microorganisms present deep in the sediments, which degrade the initial organic matter, producing notably methane. This is primary biogenic production (described for example in patent application WO 2014/040622 A1).

By chemical and/or thermodynamic transformation of the organic matter under the effect of the high temperatures that prevail in the deep subsoil (described for example in patent application WO 2014/040622 A1).

By the action of certain microorganisms in the deep subsoil, which degrade certain hydrocarbons, producing notably methane This biogenic production starts from liquid hydrocarbons (described for example in French Patent Application 2888251 corresponding to U.S. Pat. No. 8,753,867)

Migration of the Hydrocarbons

This same software can also simulate transport of the hydrocarbons which are produced, notably primary and secondary biogenic methane, based on the assumption that the latter are displaced in the form of one or more phases, separated from the aqueous phase, which will be called "hydrocarbon phases" or "free gas". Several methods are available for modeling the migration of the hydrocarbon phases which are the ray tracing method (Sylta, Modeling techniques for hydrocarbon migration, in EAGE 64th Conference and Exhibition, Florence, 2002) and the invasion percolation method (Carruthers, Transport modeling of secondary oil migration using gradient-driven invasion percolation techniques. PhD thesis, Heriot-Watt University, Edinburgh, Scotland, U K, 1998), and solving the generalized Darcy equations (Schneider, Modeling multi-phase flow of petroleum at the sedimentary basin scale. Journal of Geochemical Exploration 78-79 (2003) 693-696).

The hydrocarbons trapped in petroleum reservoirs predominantly result from the transformation of solid organic matter into hydrocarbons, mainly under the action of heat. The latter is often characterized by its total organic carbon (TOC) and its hydrogen index (HI), from which we can find the oil and gas potential of the source rock (i.e. its capacity for producing hydrocarbons, its richness). The values of HI and TOC are evaluated conventionally in the current state (i.e. after possible thermal alteration that occurred in the geological conditions), using tools such as Rock-Eval® (IFP Energies nouvelles, France).

The objectives of the basin models include estimating the amounts of hydrocarbons generated by the source rocks and trapped in the petroleum reservoirs. These quantities thus depend directly on the spatial distribution of the organic matter and its richness. However, it is very difficult to obtain a proper representation of these parameters, as the source rocks (which contain the organic matter) are only known when they form outcrops (they can then be characterized relatively well, but their characterization is of less importance, as they are then unlikely to have generated hydrocarbons, or it is unlikely that the latter are still exploitable), or when oil wellbores have been able to reach it. For so-called "conventional" reservoirs, oil-well drilling unfortunately very seldom goes as far as the source rock, making it difficult to determine the distribution of the richness of the organic matter. Even in the case of so-called "unconventional" reservoirs, for which the reservoir is generally the source rock itself, it is still difficult to determine it correctly, as the density of the wells is not always sufficient to get an overall picture of the distribution of the organic matter.

In basin modeling, data concerning the richness of the organic matter are indispensable for simulating the generation and migration of the hydrocarbons, and users are therefore obliged to construct maps of TOC and HI based on the small amount of data in their possession. The maps are then often uniform (same value on the whole map) or are obtained by mathematical interpolation/extrapolation (kriging methods, "smoothing" etc.) starting from a few points. The processes responsible for deposition of the organic matter are thus not taken into account when determining the maps of richness.

Another solution that takes into account the processes connected with deposition of the organic matter is the use of tools for modeling sedimentary deposits such as Dionisos-Flow® (IFP Energies nouvelles). However, these tools demand a large investment of time as they require a large amount of additional data, additional simulations, and skills that the users of basin modeling do not necessarily possess.

SUMMARY OF THE INVENTION

To overcome these drawbacks, the present invention relates to a method for exploitation of a sedimentary basin. Exploitation of a sedimentary basin is permitted by the choice of zones of interest within the basin, the zones being determined by means of maps of total organic carbon TOC and of hydrogen index HI of at least one sedimentary layer. According to the invention, maps of total organic carbon TOC and of hydrogen index HI are obtained taking into account the current values of TOC and HI at the level of the well and taking into account the maps of bathymetry and of sedimentation rate. Thus, the method according to the invention makes it possible to determine maps of richness of TOC and HI before these properties are affected by the thermal processes on the basis of the information available to the basin modeler (generally TOC and HI in a few wells, generally affected by the thermal processes) and physical and chemical processes (maps of sedimentation and bathymetry) without having recourse to simulations of sedimentary deposition, which would require more time, data and skills.

The invention relates to a method for exploitation of a sedimentary basin comprising at least one sedimentary layer, with at least one well passing through it, wherein the current value of total organic carbon $TOC_A(W)$ and the current value of the hydrogen index $HI_A(W)$ at the level of at least one well, a bathymetry map and a map of sedimentation rate of the sedimentary layer, are known. For this method, the following steps are performed:

a) for at least one sedimentary layer, maps are constructed of total organic carbon $TOC_0$ and of hydrogen index $HI_0$ at a time of deposition of the sedimentary layer based on the current values of total organic carbon $TOC_A(W)$ and hydrogen index $HI_A(W)$ at the level of the well, and by use of the maps of a bathymetry and of a sedimentation rate of the sedimentary layer;

b) at least one zone of the sedimentary basin comprising hydrocarbons is determined by use of the maps of total organic carbon $TOC_0$ and of hydrogen index $HI_0$ at a time of deposition of the sedimentary layer; and c) the zone of the sedimentary basin is exploited.

According to one embodiment of the invention, for at least one sedimentary layer, maps are constructed of total organic carbon $TOC_0$ and of hydrogen index $HI_0$ at a time of deposition of the sedimentary layer using the following steps:

i) constructing models of total organic carbon $TOC_0$ and of hydrogen index $HI_0$ at every point of the sedimentary layer at a time of deposition of the sedimentary layer, the models connecting the total organic carbon $TOC_0$ and the hydrogen index $HI_0$ at every point of the sedimentary layer at the time of deposition of the sedimentary layer, with the maps of bathymetry and of sedimentation rate of the sedimentary layer with chemical and biological parameters of the sedimentary layer;

ii) adjusting the models by determining the chemical and biological parameters by use of the current values of total organic carbon $TOC_A(W)$ and the value of the hydrogen index $HI_A(W)$ at a level of the well; and iii) constructing the maps of total organic carbon $TOC_0$ and of hydrogen index $HI_0$ at a time of deposition of the sedimentary layer by applying the adjusted models in every grid cell of the sedimentary layer by of the chemical and biological parameters determined and the maps of sedimentation rate and bathymetry.

Advantageously, the models are adjusted using the following steps:

(1) selecting biological and chemical parameters of the sedimentary layer;

(2) determining values of total organic carbon $TOC_{OS}(W)$ and of hydrogen index $HI_{OS}(W)$ at a level of the well at a time of deposition of the sedimentary layer by use of the models, the selected biological and chemical parameters and the maps of bathymetry and of sedimentation rate;

(3) calculating a value of total organic carbon $TOC_{OCB}(W)$ at a level of the well at the time of deposition of the sedimentary layer by use of a carbon balance and the values of total organic carbon $TOC_A(W)$ and the current value of the hydrogen index $HI_A(W)$ at the level of the well;

(4) comparing the values, determined $TOC_{OS}(W)$ and calculated $TOC_{OCB}(W)$, of total organic carbon at a level of the well at the time of deposition of the sedimentary layer, and repeating steps (2) to (4), and modifying the biological and chemical parameters to minimize the difference between the values being compared.

According to one embodiment, value of total organic carbon $TOC_{OCB}(W)$ at the level of the well at a time of deposition of the sedimentary layer is calculated by use of a formula:

$$TOC_{0BC}(W) = \frac{TOC_A(W)}{1 - \frac{IH_{0S}(W) - IH_A(W)}{1000} \times 0.84}$$

Alternatively, the value of total organic carbon $TOC_{OCB}(W)$ at a level of the well at a time of deposition of the sedimentary layer is calculated by use a formula:

$$TOC_{0BC}(W) = \frac{TOC_A(W) - 0.84 \times S1}{1 - \frac{IH_{0S}(W) - IH_A(W)}{1000} \times 0.84}$$

where S1 is an amount of free oil.

Preferably, the value of total organic carbon $TOC_{OCB}(W)$ at the level of the well at a time of deposition of the sedimentary layer is a function of a parameter relating to the formation of biogenic gas within the sedimentary layer.

According to one embodiment of the invention, the biological and chemical parameters are parameters that are representative of deposition of organic matter and/or of reduction and/or oxidation reactions.

According to one embodiment of the invention, the models are formed by interpolation of the values of total organic carbon $TOC_0(W)$ and of hydrogen index $HI_0(W)$ at a level of the well at a time of deposition of the sedimentary layer, the interpolation being constrained by the maps of sedimentation rate and bathymetry.

Advantageously, the current values of total organic carbon $TOC_A(W)$ and hydrogen index $HI_A(W)$ at a level of the well are determined by analysis of pyrolysis of a rock sample from the sedimentary layer.

According to one embodiment of the invention, at least one zone of the sedimentary basin comprising hydrocarbons is determined by means of a model of the sedimentary basin constructed by use of the maps of total organic carbon $TOC_0$ and of hydrogen index $HI_0$ at a time of deposition of the sedimentary layer.

Moreover, the invention relates to a computer software product downloadable from a communication network and/or recorded on a computer-readable medium and/or executable by a processor, comprising program code instructions for carrying out a method according to one of the preceding characteristics, when the program is executed on a computer.

BRIEF DESCRIPTION OF THE FIGURES

Other features and advantages of the method according to the invention will become clear on reading the following description of nonlimiting embodiment examples, referring to the appended figures, which are described below.

DETAILED DESCRIPTION OF THE INVENTION

The present invention relates to a method for exploitation of a sedimentary basin. The sedimentary basin comprises at least one sedimentary layer, and at least one well passes through it, for example an exploratory well, an input well or an output well.

Notations:

The following notations are used throughout the description:

TOC: carbon content, with:

$TOC_A$ is a current value of the carbon content;

$TOC_0$ is a value of carbon content during deposition of the sedimentary layer;

$TOC_{OS}$ is a value of simulated carbon content obtained by the model according to the invention with a value being the value during deposition of the sedimentary layer;

$TOC_{OCB}$ is a value of calculated carbon content obtained by a carbon balance with the value being the value during deposition of the sedimentary layer, HI is a hydrogen index, wherein:

$HI_A$ is a current value of the hydrogen index;

$HI_0$ is a value of the hydrogen index during deposition of the sedimentary layer;

$HI_{OS}$ is a value of the simulated hydrogen index obtained by the model according to the invention with the value being the value during deposition of the sedimentary layer.

These symbols, when followed by the notation (W), denote values at a level of a well. When they are not followed by the notation (W), they denote the values at any point of the sedimentary layer.

The current value, or value at the current time, is the value obtained by measurement at the present time point (at the current time step), at which the method according to the invention is carried out and the rock may have undergone thermal alterations in the geological conditions. Conversely, the value during deposition or at the time of deposition of the sedimentary layer corresponds to the value at the geological time (i.e. at the geological time step), at which the sedimentary layer has formed.

Figure 3:
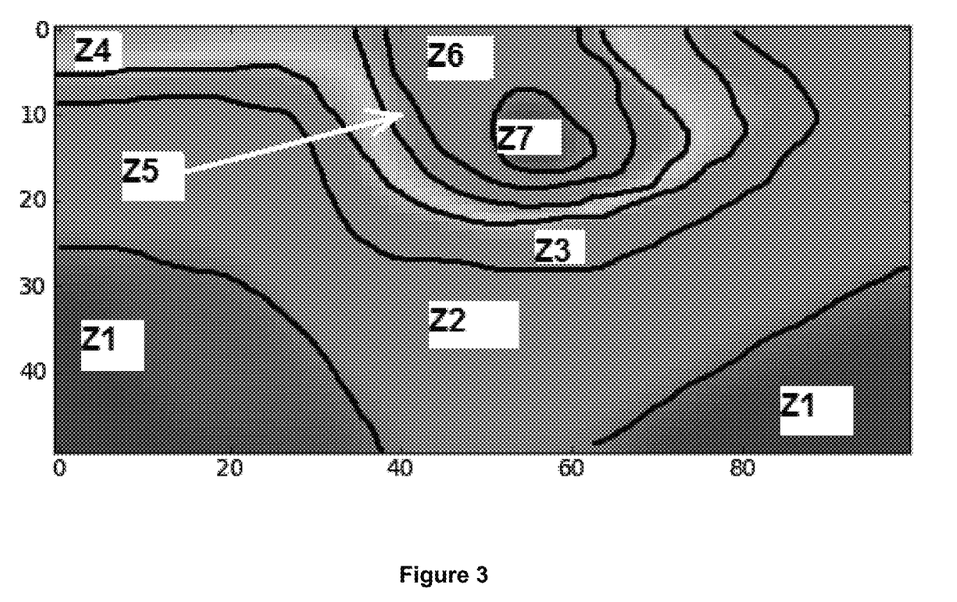
FIG. 3 illustrates a bathymetry map for one example.
Figure 4:
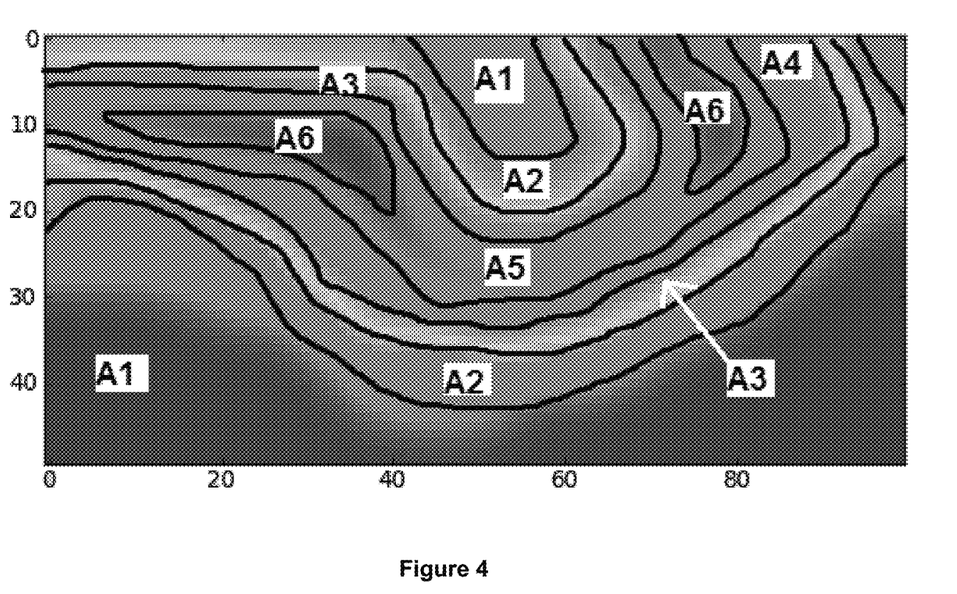
FIG. 4 illustrates a map of sedimentation rate for the example in FIG. 3.

The method of exploitation according to the invention uses the following information:

$TOC_A(W)$ is a current value of a carbon content at the level of at least one well with this value being obtained using tools for analysis of rock samples taken from the sedimentary basin, such as Rock-Eval® (IFP Energies nouvelles, France) or any similar tool;

$HI_A(W)$ is a current value of the hydrogen index at a level of at least one well with this value being obtained using tools for analysis of rock samples taken from the sedimentary basin, such as Rock-Eval® (IFP Energies nouvelles, France) or any similar tool;

a bathymetry map of the sedimentary layer, which is a map showing a depth of the grid cells of the map relative to sea level is generally used during construction of the basin model; FIG. 3, which is described in detail later on in the description, is an example of a bathymetry map; and a map of sedimentation rate, which is a map that is representative of a duration of deposition and of the thickness of the event, is generally used during construction of the basin model; FIG. 4, which is described in detail later on in the description, is an example of a map of sedimentation rate.

A grid representation of the sedimentary layer is called a map which represents a model of the sedimentary layer. A property of the grid cell is assigned to each grid cell. For example, the property may be bathymetry, sedimentation rate, total organic carbon, hydrogen index, etc. Conventionally, the map is a digital representation, performed on a computer.

It will be recalled that Rock-Eval® (IFP Energies nouvelles, France) is a system using pyrolysis of rock obtained from the subsoil. In fact it quickly supplies a variety of information on the organic content of the rocks, such as the oil and gas potential of the series encountered, the nature of the kerogens, and their state of maturation. The system and the method are notably described in French Patent Application 2722296 and corresponding U.S. Pat. No. 5,843,787. For example, Rock-Eval® (IFP Energies nouvelles, France) can supply classical parameters such as:

amount of free gases: S0;
amount of free oils: S1';
oil and gas potential, or hydrocarbons from pyrolysis: S2;
temperature of the top of the peak S2: TMax;
total organic carbon, TOC; and
hydrogen index HI The method according to the invention comprises the following steps:

1) constructing maps of TOC and HI for at least one sedimentary layer;
2) determine a zone of interest; and
3) exploiting the sedimentary basin.

Figure 1:
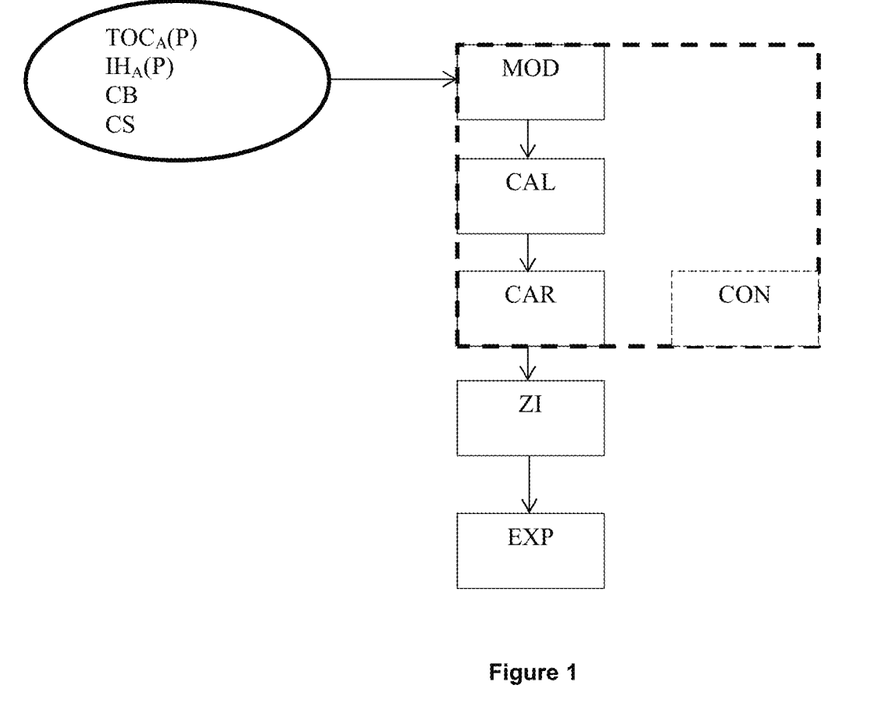
FIG. 1 illustrates the steps of the method of exploitation according to one embodiment of the invention.

FIG. 1 is a schematic, nonlimiting illustration of the steps of the method according to one embodiment of the invention. For the method illustrated, the following information is known: the current value of the carbon content at a level of a well $TOC_A(W)$, the current value of the hydrogen index at a level of a well $HI_A(W)$, the bathymetry map BM and the map of sedimentation rate SM. A first step is a construction step CON of the maps of total organic carbon TOC and of index hydrogen HI for at least one sedimentary layer. According to one embodiment of the invention, described in detail later on in the description, the construction step CON may comprise a modeling step MOD, a step of adjusting the models ADJ, and a step of application of the models to form the maps CAR. After the construction step CON, the method according to the invention may comprise a step of determining at least one zone of interest ZI, as a function of the maps of TOC and HI are constructed, for example by reservoir modeling. Finally, the method according to the invention comprises exploiting the sedimentary basin EXP as a function of the specified zone of interest ZI.

Step 1) Construction of the Maps of TOC and HI

In this step, the maps of total organic carbon TOC and of hydrogen index HI are constructed for at least one sedimentary layer of the sedimentary basin. The values of TOC and HI of the maps are those determined at a time of deposition of the sedimentary layer. Preferably, the maps of TOC and HI are constructed for each sedimentary layer of the sedimentary basin that may comprise hydrocarbons. This step 1) is then repeated for each layer of the sedimentary basin to be studied.

This step may be performed numerically.

According to one embodiment of this step, the maps of TOC and HI can be constructed using the following steps:

i) constructing models of total organic carbon $TOC_0$ and of hydrogen index $HI_0$ at every point of the sedimentary layer at a time of deposition of the sedimentary layer with the models connecting the total organic carbon $TOC_0$ and the hydrogen index $HI_0$ at every point of the sedimentary layer at a time of deposition of the sedimentary layer, with maps of bathymetry and a sedimentation rate of the sedimentary layer, and with chemical and biological parameters of the sedimentary layer;

ii) adjusting the models by determining the chemical and biological parameters by use of current values of total organic carbon $TOC_A(W)$ and a value of the hydrogen index $HI_A(W)$ at a level of the well; and iii) constructing the maps of total organic carbon $TOC_0$ and of hydrogen index $HI_0$ at a time of deposition of the sedimentary layer by applying adjusted models at every point of the sedimentary basin by use of determined chemical and biological parameters determined and the maps of sedimentation rate and bathymetry.

The biological and chemical parameters of the models of TOC and of HI may be parameters representative of the deposition of organic matter and/or of the reduction and/or oxidation reactions of the organic matter.

The models therefore take into account data relating to bathymetry and the sedimentation rate, which are variable within the sedimentary layer. Consequently, the models may therefore be representative of the sedimentary layer which take these geological phenomena into account. Moreover, the models take into account biological and chemical conditions, which allow these models to be kept consistent with the biological and chemical phenomena within the sedimentary layer.

Thus, the model of total organic carbon $TOC_0$ at every point of the sedimentary layer at a time of deposition of the sedimentary layer may be written in the form of a function f:

$$TOC_0 = f(BM, SM, BP, CP)$$

where BM denotes the bathymetry map (known), SM denotes the map of sedimentation rate (known), BP denotes biological parameters (to be adjusted) and CP denotes chemical parameters (to be adjusted).

Similarly, the model of hydrogen index $HI_0$ at every point of the sedimentary layer at a time of deposition of the sedimentary layer may be written in the form of a function g:

$$HI_0 = g(BM, SM, BP, CP)$$

where BM denotes a bathymetry map (known), SM denotes a map of sedimentation rate (known), BP denotes a biological parameters (to be adjusted) and CP denotes chemical parameters (to be adjusted).

The purpose of adjustment is to determine the biological and chemical parameters that can make the model consistent with the known values at level of the well. Adjustment of the models is performed by means of current values of total organic carbon $TOC_A(W)$ and a value of hydrogen index $HI_A(W)$ at a level of the well. Thus, the models are adjusted with measured data and provide consistency between models and real data.

According to one embodiment, for which current values of total organic carbon $TOC_A(W)$ and of the hydrogen index $HI_A(W)$ are known at a level of several wells, adjustment may be employed for determining biological and chemical parameters that can make the model consistent with current values for all the wells.

Figure 2:
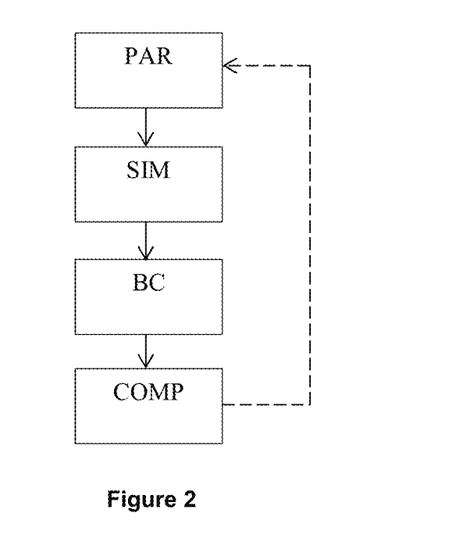
FIG. 2 illustrates the steps of adjusting the model according to one embodiment of the invention.

FIG. 2 is a schematic, nonlimiting illustration of the steps of adjusting the model. First, biological and chemical parameters PAR are selected. These parameters PAR are used for simulating SIM, that is for determining, with an aid of the models, values of TOC and HI at a level of the well during deposition of a sedimentary layer. Then, by means of a carbon balance CB, a value of TOC at level of well during deposition of a sedimentary layer is calculated. Finally, the simulated TOC value and calculated TOC value are compared COMP. If the difference between the simulated value and the calculated value is not minimal, the preceding steps are repeated (arrow shown with dotted lines) and changing biological and chemical parameters. If the reverse is true, the biological and chemical parameters that minimize the difference between the simulated value and the calculated value are retained. In the case of several wells, the optimal biological and chemical parameters are found by minimizing sum of differences, by a classical method (for example the method of least squares).

According to a preferred embodiment of the invention, adjustment may be performed using the following steps:

(1) selecting biological and chemical parameters of sedimentary layer;

(2) determining values of total organic carbon $TOC_{0S}(W)$ and of hydrogen index $HI_{0S}(W)$ at a level of a well at a time of deposition of the sedimentary layer by means of the models where the biological and chemical parameters are selected in a preceding step or are modified for a new iteration, and the maps of bathymetry and sedimentation rate;

(3) calculating a value of total organic carbon $TOC_{0CB}(W)$ at a level of the well at a time of deposition of the sedimentary layer by use of a carbon balance and current values of total organic carbon $TOC_A(W)$ and a current value of a hydrogen index $HI_A(W)$ at a level of the well;

(4) comparing value of $TOC_{0S}(W)$ which has been determined and a value calculated $TOC_{0CB}(W)$ of total organic carbon at a level of the well at a time of deposition of a sedimentary layer, and repeating steps (2) to (4), changing the biological and chemical parameters to minimize the comparison. For example, if the comparison is above a threshold, the biological and chemical parameters are altered, and if the comparison is below this threshold, then the biological and chemical parameters used in the models are those that allow this comparison.

For the first iteration, any biological and chemical parameters may be selected, or they depend on measurements. For the subsequent iterations, the biological and chemical parameters are determined to minimize a difference between the simulated value and a calculated value.

For a step of determining values $TOC_{0S}(W)$ and $HI_{0S}(W)$, the models are applied at a level of the well, with the selected parameters and the known maps of sedimentation rate and bathymetry.

For the step of calculating the value of $TOC_{0CB}(W)$, a carbon balance is applied at a level of the well. According to a first alternative, the value of total organic carbon $TOC_{0CB}(W)$ may be calculated at the level of the well at a time of deposition of the sedimentary layer by use a formula:

$$TOC_{0BC}(W) = \frac{TOC_A(W)}{1 - \frac{IH_{0S}(W) - IH_A(W)}{1000} \times C}$$

where C is a constant corresponding to a ratio as percentage of organic carbon in the hydrocarbons. Conventionally, constant C may have a value of 0.84. According to a second alternative, the value of total organic carbon $TOC_{0CB}(W)$ at a level of the well at a time of deposition of the sedimentary layer may be calculated by use a formula:

$$TOC_{0BC}(W) = \frac{TOC_A(W) - 0.84 \times S1}{1 - \frac{IH_{0S}(W) - IH_A(W)}{1000} \times C}$$

where S1 is an amount of free oils which may be measured using the tool Rock-Eval® (IFP Energies nouvelles, France), and C is a constant corresponding to a ratio as a percentage of organic carbon in the hydrocarbons. Conventionally, constant C may have a value of 0.84. For these two alternatives, carbon balance depends on a value determined for the hydrogen index $HI_{0S}(W)$ and data at a level of a well. Moreover, a carbon balance used for calculating a value of $TOC_{0CB}(W)$ may be a function of a formation of the biogenic gas, so as to be more complete.

Comparison of a value determined by models and the calculated value maybe a mathematical comparison of values for minimizing the difference between a value which is determined by the models and the value determined by carbon balance. If these values are inconsistent, the steps are reiterated, optimizing biological and chemical parameters. For the embodiment for which several current values of total organic carbon $TOC_A(W)$ and hydrogen index $HI_A(W)$ are known at a level of several wells, the comparison may be a function of a comparisons at a level of each well, for example by means of a method of least squares.

At the end of adjustment, models of the value of total organic carbon and of hydrogen index are fully parameterized. The maps of TOC and HI for the sedimentary layer may therefore may be constructed by applying an adjusted model (with the adjusted biological and chemical parameters and the known maps of bathymetry and sedimentation rate) to all the grid cells representative of the sedimentary basin.

The advantage of the method according to the invention is that it then makes it possible to determine maps of $TOC_0$ and of $HI_0$ at a scale of a basin on a basis of the chemical and biological processes. The method according to the invention does not make any a priori hypothesis about the value of the hydrogen index $HI_0$, which is determined in the procedure for optimizing the chemical and biological parameters. In the conventional approaches of the prior art, a hypothesis about $HI_0$ is necessary for calculating the value of total organic carbon $TOC_0$ using equations derived from the carbon balances. Through lack of information, an $HI_0$ that is spatially homogeneous in a basin is used. Now, variable conditions of sedimentation rate and bathymetry in the basin are known and it can be seen that they can lead to spatial variations of $HI_0$ (as illustrated in FIG. 4) if they are taken into account.

Step 2) Determination of a zone of interest

Using maps of TOC and HI of a sedimentary layer, at least one zone of interest of the sedimentary basin that may comprise hydrocarbons is determined. In fact, content of organic carbon and of hydrogen are indices of zones in which hydrocarbons have been able to form and/or accumulate.

Preferably, this step is carried out by basin modeling that integrates the constructed maps of TOC and HI. It provides a predictive mapping of the subsoil which indicates a probable location of a deposits, as well as content, nature and pressure of hydrocarbons that are trapped there, taking into account genesis, migration and optionally the degradation of the hydrocarbons. The basin model is based on a spatial and temporal discretization of the basin, and it represents a model of the sedimentary basin. Spatial discretization is organized in layers of grid cells representing the geological strata. At least one property of the grid cell is assigned to each grid cell, for example rock density, porosity, total organic carbon TOC, hydrogen index HI, etc. Temporal discretization is based on slicing the time into elementary time intervals: the "time steps". A complete simulation is a set of time sequences, which are called "events", which in their turn are subdivided into time steps. An event therefore lasts for at least one time step, and corresponds to the placement of a geological stratum. Conventionally, a basin model may be a digital representation, performed on a computer.

Basin modeling software makes possible simulation, in one, two or three dimensions, all of sedimentary, tectonic, thermal and hydrodynamic processes and processes of organic and inorganic chemistry that are involved during the formation of a petroleum basin. Such software constitutes a basic tool for oil exploration with its output being a set of data useful for predicting location of deposits and their economic importance.

The approach followed by most of the basin models comprises three steps:

1. a step of constructing a grid of the subsoil following a hypothesis about its internal architecture and about the properties that characterize each grid cell which for example may be their porosity, their sedimentary nature (clay, sand etc.) or their content of organic matter at a time of sedimentation. Construction of this model is based on data acquired by seismic surveys or measurements during drilling operations. This grid is structured in layers with one group of grid cells being assigned to each geological stratum of the modeled basin.
2. a step of reconstruction of a grid representing previous states of the basin architecture. This step is carried out for example using a "backstripping" method (Steckler, M. S., and A. B. Watts, Subsidence of the Atlantic-type continental margin off New York, Earth Planet. Sci. Lett., 41, 1-13, 1978) or a method of structural restoration (described for example in patent application FR 2930350—corresponding to U.S. Pat. No. 8,150,669). During this step, the maps of TOC and HI constructed for the sedimentary layer(s) are integrated.
3. a step of numerical simulation of a selection of physical phenomena occurring during the evolution of the basin and contributing to formation of oil traps. This step is based on a discretized representation of the time as "events" with each event being simulated by a succession of time steps. The beginning and the end of an event corresponds to two successive states in the evolution of the architecture of the basin supplied in the preceding step 2.

Based on basin modeling, at least one zone of the basin can be determined, corresponding to grid cells of the grid representation at a current time of the basin, comprising hydrocarbons, as well as content, nature and pressure of hydrocarbons that are trapped there. It is then possible to select zones of the basin under investigation that have the best oil and gas potential.

Step 3) Exploitation of the Sedimentary Basin

In this step, the zone of interest determined in the sedimentary basin is exploited.

Oil exploitation of the basin may then take several forms, notably:

exploratory drilling in the various zones selected as having the best potential, in order to confirm or contradict the potential estimated previously, and acquire new data as input for new, more precise studies, and exploitory drilling (input wells or output wells) for recovering the hydrocarbons present in the sedimentary basin in the zones selected as having the best potential.

Moreover, the invention relates to a computer software product downloadable from a communication network and/or recorded on a computer-readable medium and/or executable by a processor, comprising program code instructions for carrying out the method as described above, when the program is executed on a computer.

Illustrative Example

The method according to the invention is applied for determining the richness of the source rock in a sedimentary layer of the West Canadian basin.

This basin is currently the object of intensive oil exploration notably in the "unconventional" reservoirs of the Montney and Doig formations. As the profitability of unconventional prospects is partly connected with the richness of the source rock (which also constitutes the reservoir of the hydrocarbons), it is essential for petroleum producers to correctly estimate the distribution of the oil and gas potential in the basin before performing basin modeling.

The method for determining the TOC according to the invention was therefore applied to this basin. The zone studied represents an area of about 500 000 km² (500 km×1000 km). It corresponds to the sedimentary layers of the base of the Montney formation, deposited in the Triassic over a period of 2 million years. The basin is discretized using 5000 grid cells.

For the layer considered, we have measurements of TOC and of HI in 7 wells in the basin (to be compared with the 50×100, i.e. 5000 grid cells of the model) and maps of bathymetry (FIG. 3) and of sedimentation rate (FIG. 4).

In FIG. 3, zones Z1 have a bathymetry between −75 and −50 m, zone Z2 a bathymetry between −50 and −25 m, zone Z3 a bathymetry between −25 and 0 m, zone Z4 a bathymetry between 0 and 75 m, zone Z5 between 75 and 100 m, zone Z6 between 100 and 150 m, and zone Z7 beyond 150 m.

In FIG. 4, zones A1 have a sedimentation rate between 0 and 8 m/Ma, zone A2 between 8 and 16 m/Ma, zone A3 between 16 and 32 m/Ma, zone A4 between 32 and 56 m/Ma, zone A5 between 56 and 64 m/Ma, and zone A6 between 64 and 72 m/Ma.

The results of measurements on rock samples by Rock-Eval 6® (IFP Energies nouvelles, France) are presented in Table 1 below with the position of the wells used (positions I and J represent the numbers of the grid cells in the domain).

TABLE 1

TOC and HI measured

| Position in I | Position in J | $TOC_A(W)$ | $HI_A(W)$ |
|---|---|---|---|
| 10 | 58 | 1.36 | 0 |
| 10 | 57 | 1.39 | 52 |
| 12 | 57 | 1.49 | 143 |
| 15 | 48 | 1.52 | 21 |
| 17 | 44 | 1.66 | 59 |
| 21 | 39 | 1.02 | 105 |
| 29 | 39 | 1.00 | 189 |
| 23 | 43 | 0.64 | 182 |

Figure 5:
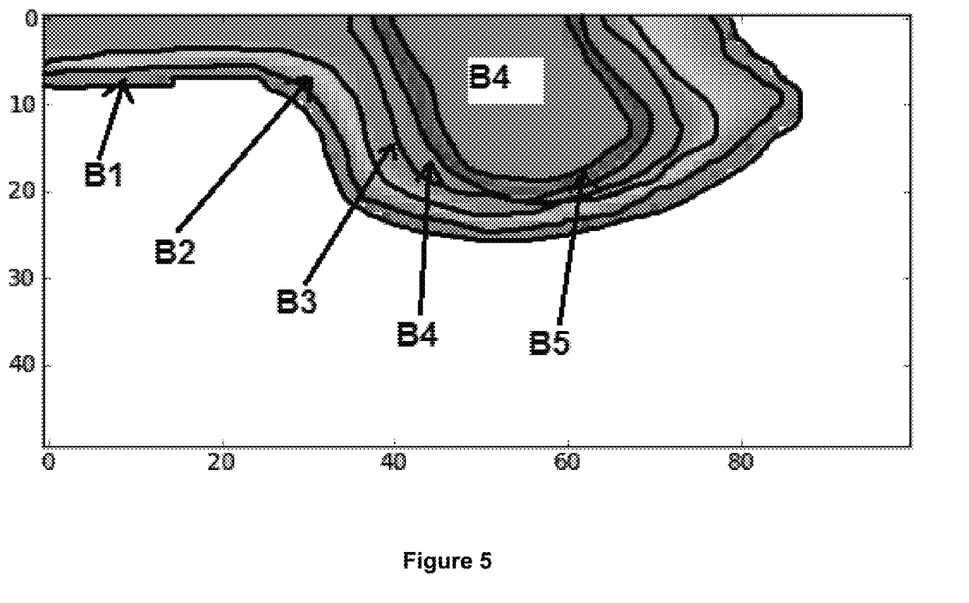
FIG. 5 illustrates a map of total organic carbon $TOC_0$ at the level of the sedimentary layer for the example in FIG. 3, the map being obtained by the method according to the invention.
Figure 6:
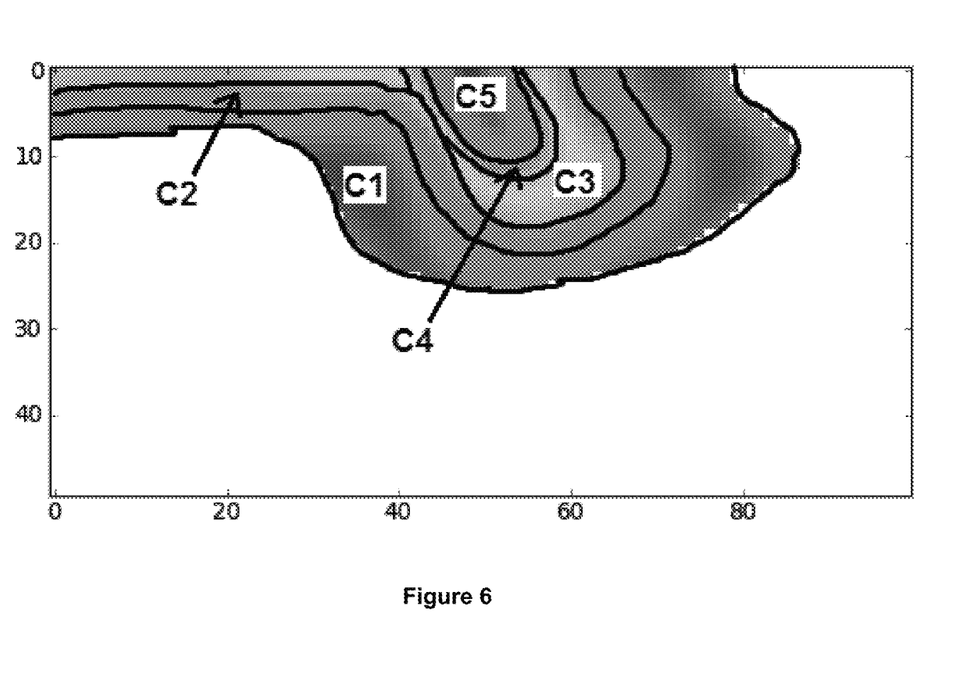
FIG. 6 illustrates a map of hydrogen index $HI_0$ at the level of the sedimentary layer for the example in FIG. 3 with the map being obtained by the method according to the invention.

Starting from this information, by use of the method according to the invention, the values of the biological and chemical parameters are determined by adjustment, then applied to the whole basin to obtain maps, at the scale of the basin, of the values of $TOC_0$ (FIG. 5) and of $HI_0$ (FIG. 6). In FIGS. 5 and 6, the white zones correspond to a continental zone, not lacustrine or marine. Consequently, in these zones there is no need to determine the contents of organic carbon and the hydrogen index.

In FIG. 5, zone B1 has a TOC between 0 and 1.2%, zone B2 a TOC between 1.2 and 2%, zone B3 a TOC between 2 and 2.4%, zone B4 a TOC between 2.4 and 2.8%, and zone B5 a TOC above 2.8%.

In FIG. 6, zone C1 has an HI above 520, zone C2 an HI between 480 and 520, zone C3 an HI between 460 and 480, zone C4 an HI between 440 and 460, and zone C5 an HI below 440.

For this comparative example, the values of $TOC_0(W)$ determined by the method according to the invention are compared with values of $TOC_0(W)$ obtained on the basis of a method of determination of $TOC_0$ from values of HI, $HI_0$ and current TOC, commonly adopted (e.g. Jarvie, 2012).

For comparison, the following formula from the prior art is used:

$$TOC_0(W) = \frac{TOC_A(W)}{1 - \frac{IH_{0S}(W) - IH_A(W)}{1000} \times 0.84}$$

TABLE 2

Simulated and calculated TOC values

| Position in I | Position in J | $TOC_0(W)$ according to the invention | $TOC_0(W)$ according to the prior art |
|---|---|---|---|
| 10 | 58 | 2.199239913 | 2.202300298 |
| 10 | 57 | 2.1640443 | 2.079777204 |
| 12 | 57 | 2.093971256 | 2.024799477 |
| 15 | 48 | 2.659069234 | 2.522195442 |
| 17 | 44 | 2.540686772 | 2.758488893 |
| 21 | 39 | 1.232681147 | 1.626519423 |
| 29 | 39 | 1.17093617 | 0.923460331 |
| 23 | 43 | 2.199239913 | 2.202300298 |

It can therefore be seen that the values of organic content at the time of deposition are very similar at the level of the wells. Construction of the map of TOC according to the invention is therefore well representative of the sedimentary basin at the level of the wells.

The invention claimed is:

1. A method for exploiting a sedimentary basin having at least one sedimentary layer, at least one well passing through the at least one sedimentary layer in the sedimentary basin, values of total organic carbon and hydrogen index being known from the at least one sedimentary layer within the at least one well and maps of bathymetry and sedimentation rate of the at least one sedimentary layer also being known, the method comprising:
   constructing maps, representing total organic carbon and hydrogen index in the at least one sedimentary layer at a time of deposition in the at least one sedimentary layer, based on the known current values of total organic carbon and hydrogen index in the at least one sedimentary layer in the at least one well and using the known bathymetry map and the known maps of sedimentation rate of the at least one sedimentary layer;
   locating at least one zone in the sedimentary basin comprising hydrocarbons by using the maps of total organic carbon and the hydrogen index at a time of deposition of the at least one sedimentary layer; and
   exploiting the located at least one zone of the at least one sedimentary basin comprising hydrocarbons by drilling at least one of an exploitory well and an exploratory well within the located at least one zone.

2. The method as claimed in claim 1 wherein the maps of total organic carbon and hydrogen index at a time of deposition of the at least one sedimentary layer are constructed for the at least one sedimentary layer, comprising steps of:
   constructing models of total organic carbon and hydrogen index in grid cells of the at least one sedimentary layer at the time of deposition of the at least one sedimentary layer which connect the total organic carbon and the hydrogen index in the grid cells of the at least one sedimentary layer to the maps of bathymetry and sedimentation rate of the at least one sedimentary layer with chemical and biological parameters of the at least one sedimentary layer;
   adjusting the models by determining the chemical and biological parameters by using current values of the total organic carbon and the hydrogen index in the at least one well; and
   constructing the maps of total organic and hydrogen index at a time of deposition of the sedimentary layer by applying the adjusted models to the grid cells of the at least one sedimentary layer by using the chemical and the biological parameters and the maps of the sedimentation rate and the bathymetry.

3. The method according to claim 2 wherein the models of total organic carbon and hydrogen index are adjusted by the following steps:
(1) selecting biological and chemical parameters from the at least one sedimentary layer;
(2) determining values of the total organic carbon and the hydrogen index at a level of the at least one sedimentary layer in the at least one well at the time of deposition of the at least one sedimentary layer by using the models of the total organic carbon and the hydrogen index and the maps of bathymetry and sedimentation rate;
(3) calculating a value of total organic carbon in the at least one sedimentary layer at the time of deposition of the at least one sedimentary layer by using a carbon balance and current values of the total organic carbon and the hydrogen index within the at least one well;
(4) comparing the values of determined organic carbon and calculated organic carbon in the at least one well; and
(5) repeating steps (2) to (4) to modify the biological and chemical parameters to minimize a value of the comparison provided by step 4.

4. The method as claimed in claim 3, wherein the value of total organic carbon $TOC_{OcB}(W)$ at the level of the well at the time of deposition of the at least one sedimentary layer is calculated using a formula:

$$TOC_{OBC}(W) = \frac{TOC_A(W)}{1 - \frac{IH_{0S}(W) - IH_A(W)}{1000} \times 0.84}$$

wherein
IHOS(W) is the hydrogen index, $TOC_A(W)$ is the current value of total organic carbon content in the at least one well at the time of deposition of the at least one sedimentary layer and $IH_A(W)$ is a current value of the hydrogen index in the at least one well.

5. The method as claimed in claim 3, wherein the value of total organic carbon $TOC_{OcB}(W)$ at the level of the well at the time of deposition of the at least one sedimentary layer is calculated using a formula:

$$TOC_{OBC}(W) = \frac{TOC_A(W) - 0.84 \times S1}{1 - \frac{IH_{0S}(W) - IH_A(W)}{1000} \times 0.84}$$

wherein
IHOS(W) is the hydrogen index in the at least one well at the time of deposition of the at least one sedimentary layer, $IH_A(W)$ is a current value of the hydrogen index in the at least one well, $TOC_A(W)$ is the current value of total organic carbon content in the at least one well, and S1 is an amount of free oil.

6. The method as claimed in claim 3, wherein the value of total organic carbon at the time of deposition of the at least one sedimentary layer is a function of a parameter relating to formation of biogenic gas within the at least one sedimentary layer.

7. The method as claimed in claim 2, wherein the biological and chemical parameters are representative of deposition of at least one of organic matter, reduction reactions, and oxidation reactions.

8. The method as claimed in claim 3, wherein the biological and chemical parameters are parameters representative of deposition of at least one of organic matter, reduction reactions, and oxidation reactions.

9. The method as claimed in claim 3, wherein the models of total organic carbon and hydrogen index are formed by interpolation of the values of the total organic carbon and of the hydrogen index at a level of the at least one well in the at least one sedimentary layer at the time of deposition of the at least one sedimentary layer with the interpolation being constrained by the maps of the sedimentation rate and the bathymetry.

10. The method as claimed in claim 4, wherein the models are formed by interpolation of the values of the total organic carbon and of the hydrogen index at a level of the at least one sedimentary layer at the time of deposition of the at least one sedimentary layer with the interpolation being constrained by the maps of the sedimentation rate and the bathymetry.

11. The method as claimed in claim 6, wherein the models are formed by interpolation of the values of the total organic carbon and of the hydrogen index at a level of the at least one sedimentary layer at the time of deposition of the at least one sedimentary layer with the interpolation being constrained by the maps of the sedimentation rate and the bathymetry.

12. The method as claimed in claim 7, wherein the models are formed by interpolation of the values of the total organic carbon and of the hydrogen index at a level of the at least one sedimentary layer at the time of deposition of the at least one sedimentary layer with the interpolation being constrained by the maps of the sedimentation rate and the bathymetry.

13. The method as claimed in claim 1, wherein the values of total organic carbon and hydrogen index at the current time in the at least one well are determined by analysis of pyrolysis of rock from the at least one sedimentary layer.

14. The method as claimed in claim 2, wherein the values of total organic carbon and hydrogen index at the current time in the at least one well are determined by analysis of pyrolysis of rock from the at least one sedimentary layer.

15. The method as claimed in claim 3, wherein the values of total organic carbon and hydrogen index at the current time in the at least one well are determined by analysis of pyrolysis of rock from the at least one sedimentary layer.

16. The method as claimed in claim 6, wherein the values of total organic carbon and hydrogen index at the current time in the at least one well are determined by analysis of pyrolysis of rock from the at least one sedimentary layer.

17. The method as claimed in claim 7, wherein the values of total organic carbon and hydrogen index at the current time in the at least one well are determined by analysis of pyrolysis of rock from the at least one sedimentary layer.

18. The method as claimed in claim 1, wherein the at least one zone of the sedimentary basin is determined by using a model of the sedimentary basin constructed by using the maps of the total organic carbon and of the hydrogen index at the time of deposition of the at least one sedimentary basin.

19. The method as claimed in claim 2, wherein the at least one zone of the sedimentary basin comprising hydrocarbons is determined using a model of the sedimentary basin constructed by using the maps of the total organic carbon and of the hydrogen index at the time of deposition of the sedimentary basin.

20. The method as claimed in claim 3, wherein the at least one zone of the sedimentary basin comprising hydrocarbons is determined by using a model of the sedimentary basin constructed by using the maps of the total organic carbon and of the hydrogen index at the time of deposition of the sedimentary basin.

21. A computer software product storing program code instructions recorded on a non-transitory computer-readable storage medium, the program code instructions when executed by a processor carry out a method for exploiting at least one zone of a sedimentary basin in the at least one sedimentary layer with values of total organic carbon, and hydrogen index being known in at least one well passing through the at least one sedimentary layer, known bathymetry maps and a map of sedimentation rate of the at least one sedimentary layer, comprising:

- constructing maps, representing total organic carbon and hydrogen index in at least one sedimentary layer at a time of deposition of the at least one sedimentary layer, based on current values of total organic carbon and hydrogen index in the at least one sedimentary layer in the at least one well using the known bathymetry maps and the known map of sedimentation rate of the sedimentary layer;
- locating at least one zone in the at least one sedimentary layer comprising hydrocarbons by using the map of total organic carbon and the map of hydrogen index at a time of deposition of the sedimentary layer; and
- exploiting the hydrocarbons in the located at least one zone of the at least one sedimentary layer by drilling the at least one of an exploratory well and an exploratory well within the at least one sedimentary layer in the at least one zone.

* * * * *